(12) United States Patent
Martiny et al.

(10) Patent No.: US 9,105,773 B2
(45) Date of Patent: Aug. 11, 2015

(54) PHOTO-DETECTOR WITH WAVELENGTH CONVERTER

(75) Inventors: Christoph Martiny, Aachen (DE); Bernd Ackermann, Aachen (DE); Marc Salsbury, Ottawa (CA); Hans-Helmut Bechtel, Roetgen (DE); Matthias Heidemann, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 482 days.

(21) Appl. No.: 12/989,439

(22) PCT Filed: Apr. 23, 2009

(86) PCT No.: PCT/IB2009/051667
§ 371 (c)(1),
(2), (4) Date: Mar. 1, 2011

(87) PCT Pub. No.: WO2009/133502
PCT Pub. Date: Nov. 5, 2009

(65) Prior Publication Data
US 2011/0140131 A1 Jun. 16, 2011

(30) Foreign Application Priority Data
Apr. 29, 2008 (EP) .................................. 08103771

(51) Int. Cl.
*H01L 31/147* (2006.01)
*H01L 31/0232* (2014.01)
*H05B 33/08* (2006.01)
(Continued)

(52) U.S. Cl.
CPC .......... *H01L 31/02322* (2013.01); *H01L 31/09* (2013.01); *H01L 31/101* (2013.01); *H01L 31/147* (2013.01); *H05B 33/0869* (2013.01)

(58) Field of Classification Search
CPC ... H01L 31/02322; H01L 31/12; H01L 33/50; H01L 25/167; H01L 31/14; H01L 31/141; H01L 31/143; H01L 31/145; H01L 31/147; H01L 31/153; H05B 33/0869
USPC ...................... 257/80–83, E33.076, E33.077, 257/E31.099, E31.101; 313/525
See application file for complete search history.

(56) References Cited

U.S. PATENT DOCUMENTS

| 4,051,374 A | 9/1977 | Drexhage et al. |
| 2002/0130326 A1 | 9/2002 | Tamura et al. |

(Continued)

FOREIGN PATENT DOCUMENTS

| EP | 1876648 A1 | 1/2008 |
| GB | 1055698 | 1/1967 |

(Continued)

OTHER PUBLICATIONS

Philips Lumileds Press Release Regarding "Lumiramic" Phosphor Technology, Aug. 7, 2007, 2 Page Document.

*Primary Examiner* — Yu Chen
(74) *Attorney, Agent, or Firm* — Meenakshy Chakravorty

(57) ABSTRACT

The invention relates to a photo-detector comprising a light sensitive element (101) and a wavelength converter (103) arranged in front of the light sensitive element, the wavelength converter being configured to convert light of a first wavelength into light of a second wavelength and to direct the light of the second wavelength to the light sensitive element. The advantage is that a stable reading across the entire visible spectrum may be provided.

6 Claims, 7 Drawing Sheets

(51) Int. Cl.
*H01L 31/09* (2006.01)
*H01L 31/101* (2006.01)

(56) References Cited

U.S. PATENT DOCUMENTS

| | | |
|---|---|---|
| 2007/0120496 A1 | 5/2007 | Shimizu et al. |
| 2007/0273290 A1 | 11/2007 | Ashdown et al. |
| 2008/0043129 A1* | 2/2008 | Li et al. ............... 348/308 |
| 2008/0081393 A1* | 4/2008 | Park et al. ............... 438/59 |

FOREIGN PATENT DOCUMENTS

| | | |
|---|---|---|
| WO | 0037904 A1 | 6/2000 |
| WO | 2006034561 A1 | 4/2006 |
| WO | 2007007238 A1 | 1/2007 |
| WO | 2007060570 A1 | 5/2007 |
| WO | 2008041150 A2 | 4/2008 |

* cited by examiner

PHOTO-DETECTOR WITH WAVELENGTH CONVERTER

FIELD OF THE INVENTION

The invention relates to photo-detectors.

BACKGROUND OF THE INVENTION

Known photo-detectors comprising e.g. photo-diodes or photo-resistors as light sensitive elements usually have wavelength-specific characteristics which are determined by a respective wavelength-dependent photo-response. Particularly, photo-detectors may be implemented in a flux feedback path of light emitting diode arrangements for sensing light emitted by a light emitting device.

Flux feedback control is expected to be implemented in a wide range of color controlled multi-light emitting diode (LED) products in the future. In order to control emitted light, a photo-detector having e.g. a stable characteristic over a wide frequency and/or a temperature range is required. The flux feedback signal may be used to monitor the temperature and aging induced flux decrease of the LEDs. Thus, it is necessary to have a photo-detector having a photo-response being stable with respect to temperature and aging. However, spectral measurements show that most silicon photo-detectors have a photo-response which is highly temperature dependent in the blue and infrared regime, whereas acceptable temperature stability is obtained in the green and red regime, respectively.

FIG. 7 shows the temperature dependent spectral photo response of a silicon photo-diode normalized by the spectral response of the photo-diode at a reference temperature, here 25° C. In FIG. 7 the reference sign 701 depicts the temperature dependence at 25° C., the reference sign 703 depicts the temperature dependence at 40° C., the reference sign 705 depicts the temperature dependence at 60° C., the temperature dependence 707 depicts the temperature dependence at 80° C., the reference sign 709 depicts the temperature dependence at 100° C. and the reference sign 711 depicts a temperature dependence at 120° C.

As depicted in FIG. 7, the temperature induced sensitivity variation has a maximum decrease at 450 nm which roughly corresponds to a typical emission wavelength of royal blue LED-emitters which are often employed in multi-LED systems using royal blue LEDs or phosphor converted white LEDs which rely on the royal blue LEDs as pump LEDs. The WO 2007/007238 A1 discloses such a concept for converting light in LEDs.

In a multi-primary system which is color controlled via flux feedback, a calibration step at room temperature relates the outputted flux of color strings to the photo-response signal measured simultaneously during calibration. If the sensor's photo-response is temperature dependent then the calibration relation will not hold anymore at a temperature of interest, e.g. at 80° C., which is to be expected in operating lamps. In the example of FIG. 7, the ratio of the sensitivity for blue light with respect to the sensitivity for green/red light varies with temperature. Thus, the flux feedback system will be provided with a too low blue signal compared to the green and red signal at higher temperatures which will lead to a color point drift of the system with temperature. Correcting for these errors requires measuring the temperature of the sensor and using the information on its specific temperature dependent sensitivity characteristics.

FIG. 6 shows an absolute spectral sensitivity as a function of temperature for the photo detector considered in FIG. 7, the photo-detector a silicon photo-diode. As depicted in FIG. 6, the sensor's sensitivity is generally lower in the blue regime than in the green and red regime. This is important for practical systems where the sensor is connected to a transimpedance amplifier and to an AD-converter with a finite resolution as depicted in FIG. 5.

FIG. 5 shows a typical sensor-transimpedance-AD-converter signal chain with a photo-diode 501, a feedback resistor 503, an operational amplifier 505 and an AD-converter 507.

The AD converter 507 outputs a linear signal with a given bit resolution for a certain voltage input range and the feedback resistor is chosen such that the resulting maximum signal fits within the certain range to obtain the best possible resolution of the signal. Due to the sensitivity of the sensor which is much lower in the blue regime, the maximum signal will be achieved for the signal when the red color string is on and the feedback resistor is chosen to output a suitable input signal to the AD converter. As the signal will be much lower for the case where the blue string is on, the resolution for the blue signal will be poor and this can lead to color control inaccuracies in the flux feedback system. One can introduce switchable feedback resistors while sensing the different color channels to adopt the input signal to the AD-converter to a good value for every color string but this adds considerably to the system complexity and costs. A further problem is that it is difficult to predict the behaviour of a particular photo-diode. The above-addressed switching requires a precise knowledge on how the photodiode will behave at the operating temperature. If this behaviour is known then the photodiode can readily be calibrated.

Therefore, a sensor with more homogenous sensitivity in the visible spectral regime would contribute to a more reliable and a simple flux sensing of all color strings.

SUMMARY OF THE INVENTION

It is an object of the invention to improve the efficiency of known photo-detectors.

This object is achieved by the features of the independent claims. Advantageous embodiments are specified in the dependent claims.

The invention is based on the finding that the efficiency of a photo-detector, for example of a photo-diode or of a photo-resistor, may be increased when placing a wavelength converter in front of the photo-detector in order to convert light of a first wavelength into light of a second wavelength at which the photo-detector has improved characteristics of a photo-response.

The invention relates to a photo-detector comprising a light sensitive element and a wavelength converter arranged in front of the light sensitive element, the wavelength converter being configured to convert light of a first wavelength into light of a second wavelength and to direct the light of the second wavelength to the light sensitive element. For example, the first wavelength may be shorter than the second wavelength. Furthermore, the first wavelength may be arranged within a first frequency band, the second wavelength may be arranged in a second frequency band, wherein the first and the second frequency band are shifted with respect to one another.

According to an embodiment, the second wavelength is determined by a wavelength at which a photo-response of the light sensitive element has another characteristic, in particular an improved temperature stability and/or an increased value of the photo-response, than a photo-response of the light sensitive element at the first wavelength.

According to an embodiment, the light sensitive element is a photo-sensor, in particular a photo-resistor or a photo-diode, or a light sensitive layer, in particular a silicon layer or a cadmium sulphide layer or a germanium layer or an indium gallium arsenide layer or a lead sulfide layer.

According to an embodiment, the wavelength converter comprises a wavelength converting material, in particular a phosphor material or inorganic phosphor material or quantum dots or nanocrystals being associated with the advantage which is that the pumped wavelength can precisely be determined.

According to an embodiment, the first wavelength is associated with blue light, the second wavelength is associated with red light or green light or amber light.

The invention further relates to an attachable wavelength converter for a photo-sensor. The attachable wavelength converter comprises an attachable element for attaching to the photo-sensor, the attachable element comprising a wavelength converter for converting light at a first wavelength into light at a second wavelength.

According to an embodiment, the wavelength converter comprises a wavelength converting material, in particular an inorganic phosphor material.

According to an embodiment, the first wavelength is associated with blue light, the second wavelength is associated with red light or green light or amber light.

The invention further relates to a photo-detector comprising a light sensitive element, in particular a photo-diode or a photo-resistor and the attachable wavelength converter.

The invention further relates to a light emitting diode arrangement, in particular a LED lamp, comprising at least one light emitting diode for emitting light and the photo-detector which is being arranged in a flux feedback path of the light emitting diode arrangement.

As illustrated in FIG. 8, the invention further relates to a multicolor light emitting device comprising a photo-detector, the light sensitive element 808 sensing a first light component 810 impinging from the wavelength converter 806 with the second wavelength and a second light component 812 directly impinging on the light sensitive element 808 at the second wavelength without being passed through the wavelength converter 806. According to a further aspect, the multicolor light emitting device may comprise a plurality of photo-detectors, each photo-detector having a wavelength converter associated with a different wavelength.

BRIEF DESCRIPTION OF THE DRAWINGS

Further embodiments of the invention will be described with respect to the following figures, in which.

DETAILED DESCRIPTION OF EMBODIMENTS

Figure 1:
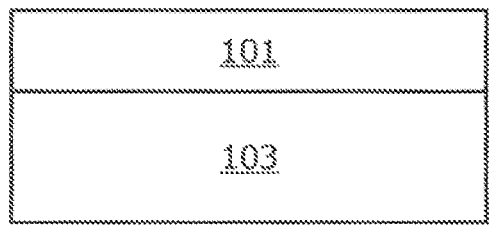
FIG. 1 shows a photo-detector.

FIG. 1 shows a photo-detector having a wavelength converter 101 arranged in front of a light sensitive element 103. The wavelength converter 101 may comprise a phosphor material or any other wavelength converting material. The photo-sensitive element 103 may be a photo-sensitive layer of a photo-diode or of a photo-resistor. According to an embodiment, the light sensitive element 103 may be a photo-diode or a photo-resistor.

The wavelength converter 101 e.g. converts blue light to a higher wavelength before it reaches a sensitive area of the light sensitive element 103 or before it reaches the light sensitive element 103. For example, the wavelength converter may comprise temperature stable light converting phosphor materials for light conversion. Preferably, the light is converted into a wavelength regime where the photo-response of the light sensitive element 103 is more stable and has a higher value than a photo-response in the blue regime.

According to an embodiment, different phosphor materials may be employed for converting light from e.g. the blue regime to higher wavelength in e.g. a green and/or amber regime.

Preferably, the wavelength converter 101 is employed to cover sensors which enables maintaining the emitted light unchanged wherein, at the photo-detector, the received light is transformed into another wavelength at which the photo-detector has a different characteristic. For example, the light converting materials may absorb blue light and re-emit the converted light at least partly into the active region of the photo-detector, i.e. photo-sensor, at longer wavelength. Thus, the wavelength dependency of the photo-detector is flattened.

Furthermore, the wavelength converter 101 may comprise phosphor materials which are very temperature stable below 100° C., by way of example. This results in an improved temperature stability of the sensor.

Figure 2:
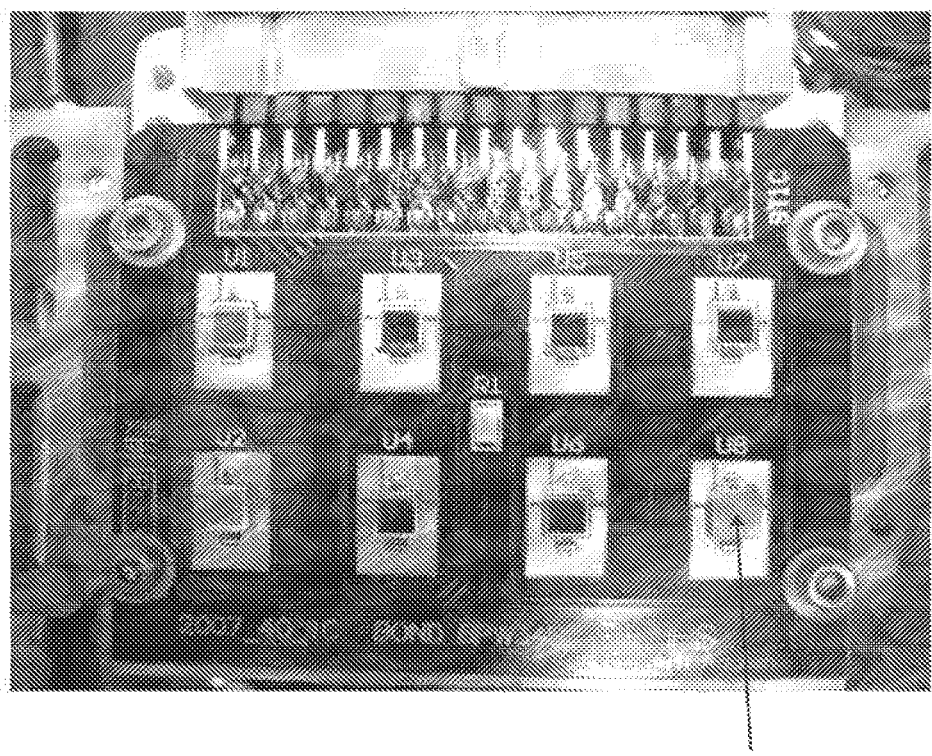
FIG. 2 shows a sensor board with a wavelength converter attached in front of a photo-detector.

According to an embodiment, the wavelength converter 101 may be formed as a separate element which may be attached in front of e.g. a common photo-detector. For example, such a wavelength converter may comprise a ceramic phosphor plate with a density greater than 95 percent compared to the density of the crystalline material, e.g. Lumiramic plate converting e.g. blue light into the amber regime as e.g. depicted in FIG. 2 showing that the wavelength converter may be arranged to form a Lumiramic plate arranged on top of a photo-diode.

Figure 3:
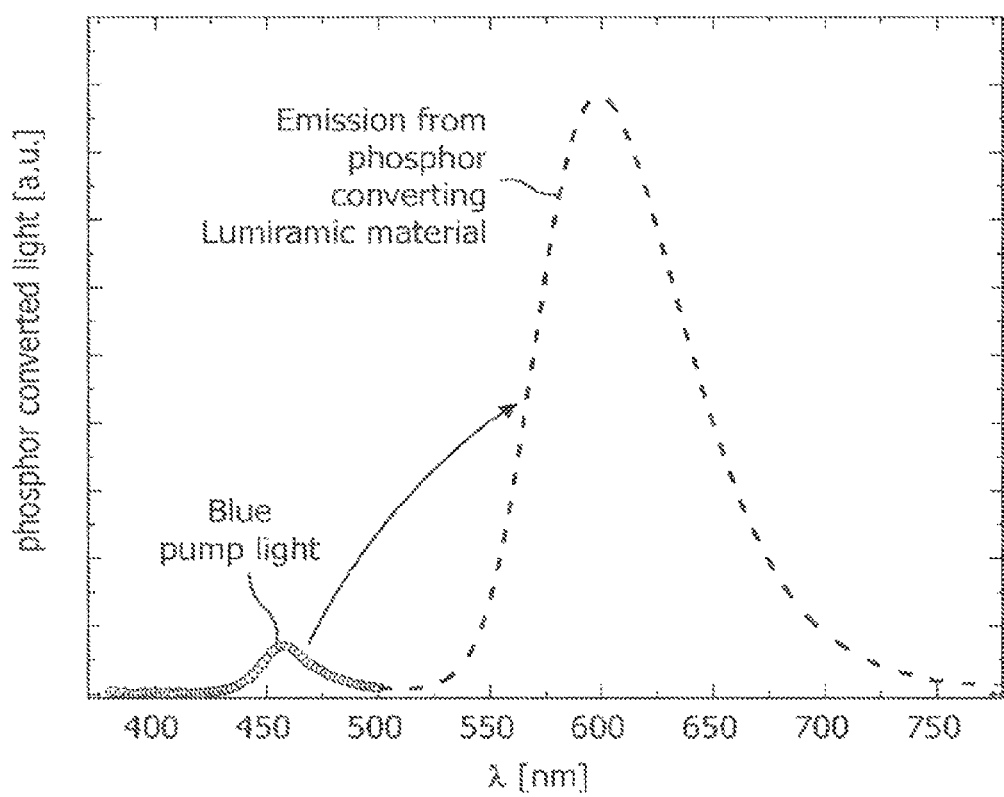
FIG. 3 shows the wavelength shift experienced by blue light incident on a phosphor Lumiramic material converting blue light to amber light.

FIG. 3 shows an emission spectrum from a wavelength converter comprising a phosphor layer, e.g. an amber Lumiramic plate of 150 μm thickness, which is arranged e.g. on top of a blue light source. As depicted by the arrows in FIG. 3, blue light is converted to amber.

Figure 4A:
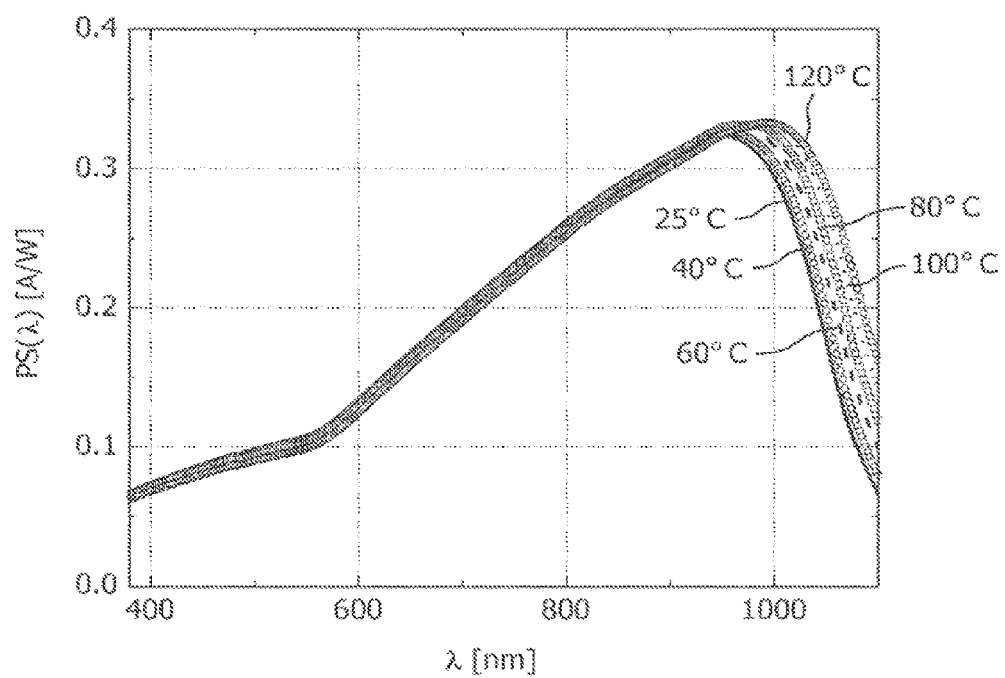
FIG. 4a shows the temperature dependent curves of the absolute spectral response of a system with wavelength converter attached in front of a photo-detector.
Figure 4B:
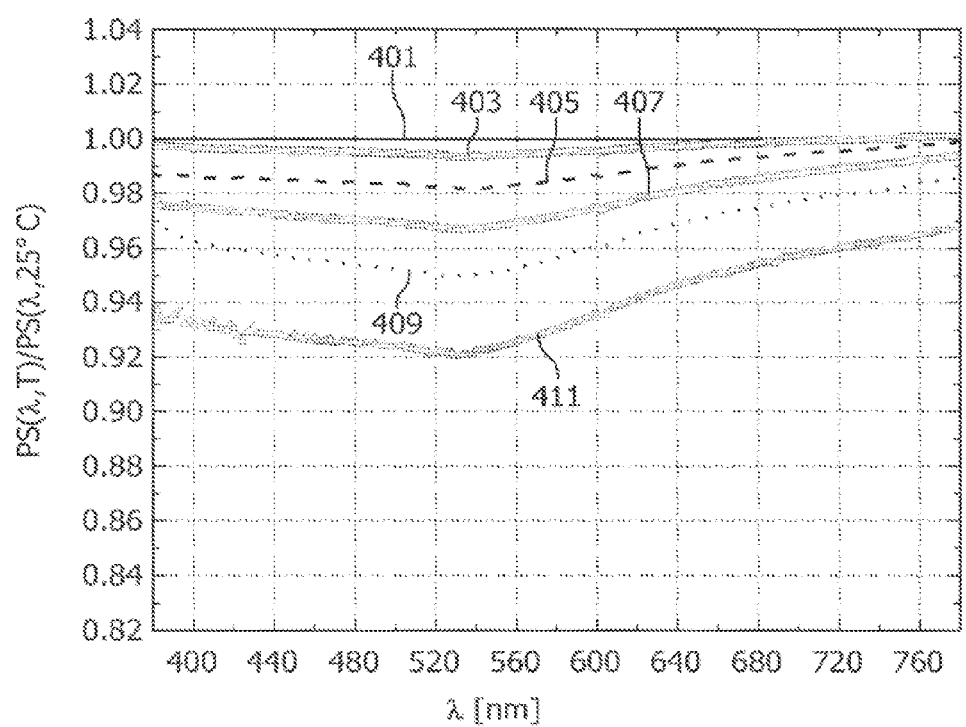
FIG. 4b shows the temperature dependent relative spectral response of a system with wavelength converter attached in front of a photo-detector with respect to its response at the reference temperature of 25° C.
Figure 5:
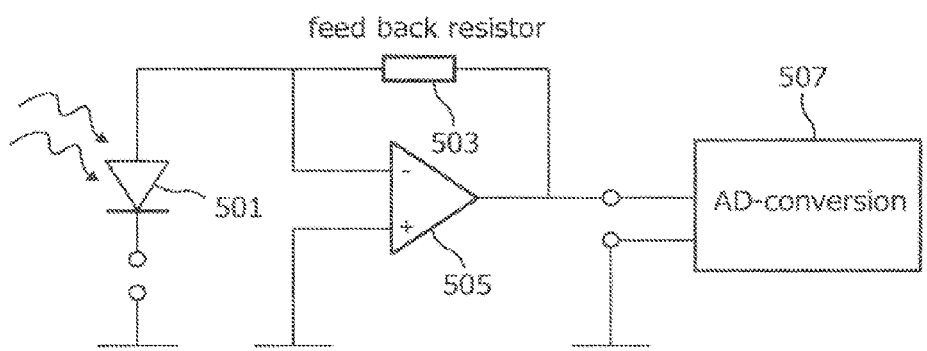
FIG. 5 shows a block diagram of a photo-detecting system.

FIGS. 4A and 4B show measured resulting spectral photo-sensitivities of a phosphor-photo-diode system. FIG. 4A shows a temperature dependent spectral photo-sensitivity of a system comprising amber Lumiramic wavelength converter arranged on a photo-diode, where the temperature is given in Kelvin. FIG. 4B shows variations of the resulting photo-detector arrangement comprising a photo-diode and an amber Lumiramic plate acting as a wavelength converter which is arranged on top of the photo-diode at different temperatures. The curve 401 shows the variations at 25° C., the curve 403 shows the variations at 40° C., the curve 405 shows the variations at 60° C., the curve 407 shows variations at 80° C., the curve 409 shows variations at 100° C. and the curve 411 shows variations at 120° C.

Figure 6:
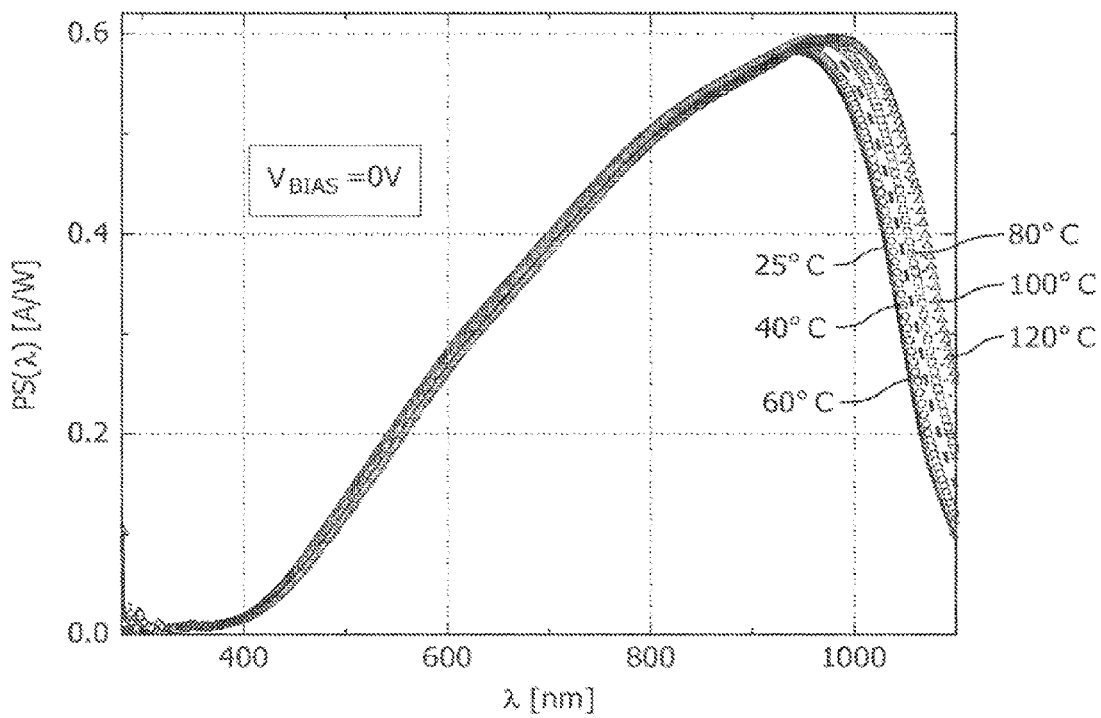
FIG. 6 shows a spectral sensitivity of a silicon photo-diode.
Figure 7:
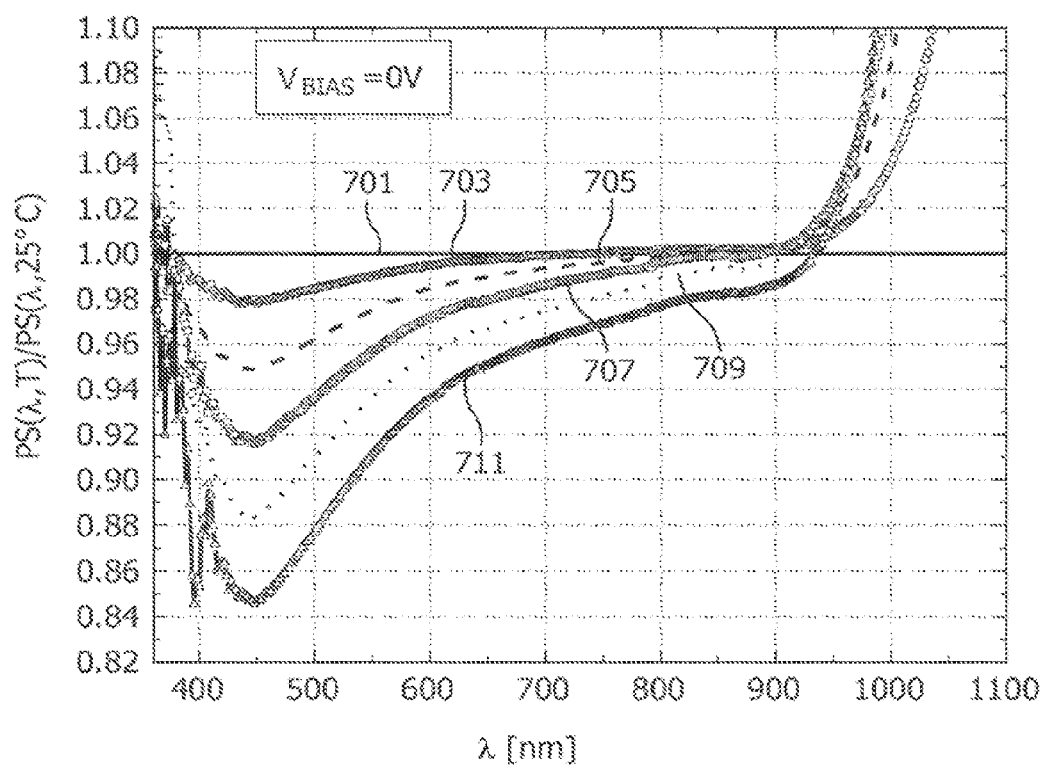
FIG. 7 shows a temperature dependence of a relative spectral photo-response of a silicon photo-diode.
Figure 8:
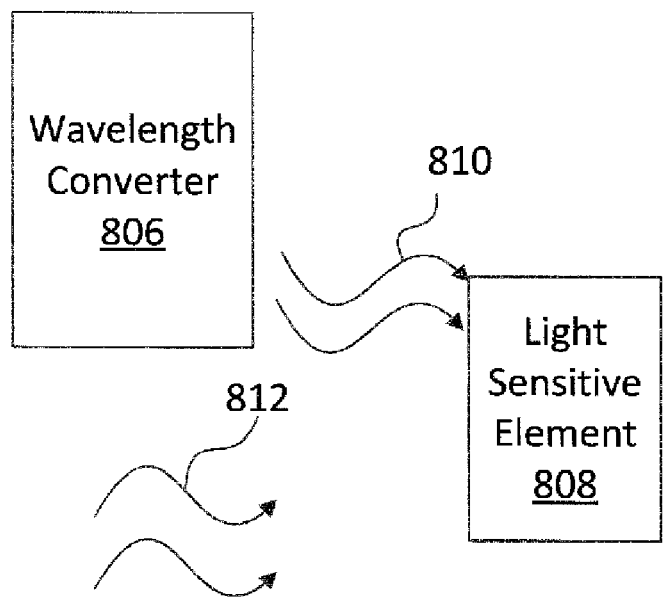
FIG. 8 shows a wavelength converter and a light sensitive element for a multicolor light emitting device.

When comparing the results shown in FIGS. 4A and 4B with the curves shown in FIGS. 6 and 7, a significant improvement of the performance of the photo-diode is demonstrated. In particular, the sensitivity in the blue regime at 450 nm has been improved which results in a sensitivity ratio of blue to red, PS(450 nm)/PS(630 nm)=0.53 when compared with PS(450 nm)/PS(630 nm)=0.17 without using a phosphor wavelength converter.

Furthermore, the temperature dependent sensitivity decrease is nearly homogeneous over the visible spectral range and is reduced to a maximum of 3% when heated from 25° C. to 80° C. Without any wavelength conversion element comprising e.g. a phosphor material, the spectral sensitivity decreases by 8% at 450 nm for the same photo-detector and same temperature variation.

The measurements show that the inventive photo-diode device is stable over a wide temperature range which is achieved by covering the photo-detector with e.g. a blue light converting phosphor material such as e.g. Lumiramic. Thus, the blue incident light is converted to a longer wavelength where the sensitivity of the silicon sensor is higher and less temperature dependent. This results in a flat spectral photo-response for all temperatures or wavelengths.

The improved efficiency of the photo-detector in the blue regime provides for an increased accuracy of measurement of a light amount which is emitted by the LED in this regime. Thus, even a little amount of light may efficiently be captured by measurement. Accordingly, the inventive approach may also be used for controlling colors of a multicolor LED comprising an array of different LEDs associated with different wavelengths, e.g., associated with different spectra like red, green or blue (RGB). For such purposes, a photo-detector associated with a certain light, e.g., red, may be used in connection with the wavelength converter converting another light, e.g., green or blue, into the certain light. Furthermore, a plurality of photo-detectors with correspondingly adopted wavelength converters may be used.

The invention claimed is:
1. A light emitting device comprising:
a plurality of light emitting diodes;
a light sensitive element; and
a wavelength converter arranged in front of the light sensitive element, the wavelength converter being configured to convert light of a first wavelength into light of a second wavelength and to direct the light of the second wavelength to the light sensitive element, the second wavelength being determined by a wavelength at which a photo-response of the light sensitive element has at least one of an improved temperature stability or an increased value of the photo-response than a photo-response of the light sensitive element at the first wavelength, wherein the light of the second wavelength directed by the wavelength converter is a first light component; and
wherein the device is configured such that the light sensitive element senses the first light component impinging from the wavelength converter with the second wavelength and a second light component directly impinging on the light sensitive element at the second wavelength without being passed through the wavelength converter.
2. The light emitting device according to claim 1, wherein the light sensitive element comprises a photo-resistor or a photo-diode.
3. The light emitting device according to claim 1, the wavelength converter comprising a wavelength converting material.
4. The light emitting device according to claim 1, the first wavelength being associated with blue light, the second wavelength being associated with red light or green light or amber light.
5. The light emitting device according to claim 1, wherein the wavelength converter and the light sensitive element are arranged in a flux feed back path of the light emitting device.
6. The light emitting device according to claim 1, wherein the light sensitive element comprises a light sensitive layer selected from the group consisting of: a silicon layer, a cadmium sulphide layer, a germanium layer, an indium gallium arsenide layer, and a lead sulfide layer.

* * * * *